(12) United States Patent
Fan

(10) Patent No.: US 6,252,410 B1
(45) Date of Patent: Jun. 26, 2001

(54) PICO FUSE OPEN OR SHORT DETECTOR TOOL

(75) Inventor: Chen Mei Fan, Hsin Chu Hsien (TW)

(73) Assignee: Taiwan Semiconductor Manufacturing Company, Ltd, Hsin Chu (TW)

(*) Notice: Subject to any disclaimer, the term of this patent is extended or adjusted under 35 U.S.C. 154(b) by 0 days.

(21) Appl. No.: 09/240,461

(22) Filed: Jan. 29, 1999

(51) Int. Cl.[7] ............................. G01R 31/02; G01R 1/06
(52) U.S. Cl. ............................................. 324/550; 324/149
(58) Field of Search ........................... 324/550, 149, 324/72.5, 555, 537

(56) References Cited

U.S. PATENT DOCUMENTS

| | | | | |
|---|---|---|---|---|
| 4,525,664 | * | 6/1985 | Trammell, Jr. | 324/550 |
| 5,378,990 | * | 1/1995 | Terry | 324/550 |

\* cited by examiner

Primary Examiner—Safet Metjahic
Assistant Examiner—J Kerveros
(74) Attorney, Agent, or Firm—Tung & Associates

(57) ABSTRACT

A pico fuse detector assembly incorporating a probe structure that minimizes short-out of closely adjacent pico fuses during testing has two probe arms, each pivotably connected at one end to a detector body with their free ends adjustably dispaceable from each other and respectively accomodating improved probe elements thereon. Each probe element has a conductive lead disposed inside an insulating housing connected at one end to a set of test contacts extending from the bottom of the housing. The other end of the lead is coupled by a spring to a test circuit. The restricting of the contact area with the isolating housing limits the chance of the contacts accidentally being placed at a location to cause damage to two closely arranged adjacent pico fuses under test and thus obviates the problem of fuse short-out during measuring of the closely arranged fuses. Also, the contacts and lead are axially movable by virtue of the spring-mounting to the test circuit. When a pico fuse is open or shorted, this condition can be readily indicated by controlling the lighting of an LED lamp built into the detector body, that is actuated by a typical oscillation circuit built into one of the probe arms and powered by a battery built into the other probe arm. The circuit operates to cause the LED 30 to flash when the contacts of the two probes are shorted through the pico fuse being tested, or to light steadily or go off when the link across the probes contacts is open due to an open fuse.

16 Claims, 1 Drawing Sheet

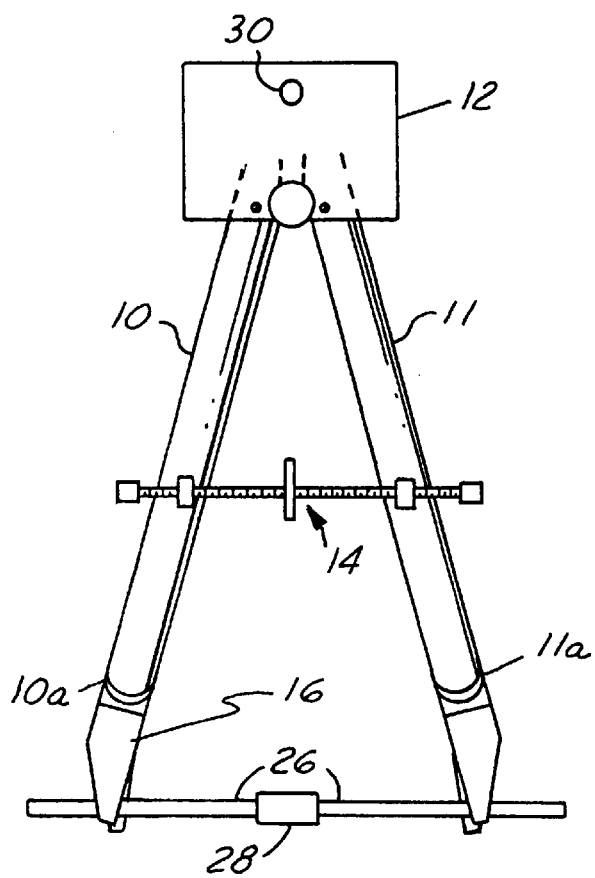
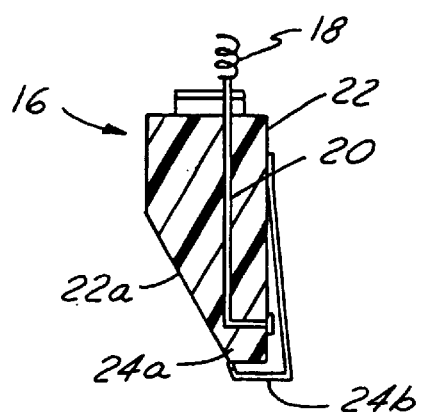
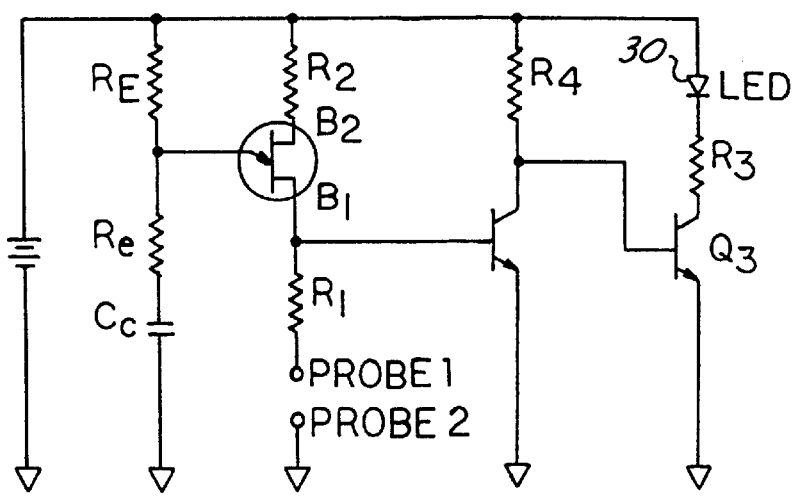

PICO FUSE OPEN OR SHORT DETECTOR TOOL

BACKGROUND OF THE INVENTION

1. Field of the Invention

The present invention relates to detector tools for testing pico fuses and, more particularly, to an improved probe element for incorporation into a detector tool to accurately check closely arranged adjacent pico fuses under test.

2. Prior Art

It is common practice to use a multimeter to determine whether a pico fuse is open or shorted. However, due to the very small distance between closely arranged adjacent fuses under test, a fuse is likely to short out when the traditional probes are employed in the detector assembly since the probes must be pointed to the precise fuse locations and the multimeter display must be read simultaneously. If the test circuitry is live, misplacement of the probes can result in short out of some of the pico fuses. Thus, it can be difficult to carry out the fuse testing with a multimeter quickly and accurately without damaging some of the pico fuses.

Objects

It is an object of the present invention to provide a detector assembly including a probe structure and elements for preventing short-out of closely adjacent pico fuses during testing when the circuitry is live.

It is another object of the invention to provide a detector assembly including a probe structure and related circuitry and an LED for readily indicating when an open or shorted fuse is detected among closely arranged adjacent pico fuses during testing.

SUMMARY OF THE INVENTION

The present invention is directed to providing a pico fuse detector assembly incorporating an improved probe structure and elements that minimize short-out of closely adjacent pico fuses during testing. A detector assembly in accordance with the present invention has two probe arms, each pivotably connected at one end to a detector body with their free ends adjustably dispaceable from each other and respectively accomodating improved probe elements thereon. Each probe element is mounted on the free end of the probe arm and has a conductive lead disposed inside an insulating housing and connected to a set of test contacts extending from the bottom of the housing. The contacts are adapted to engage conductors connected to and extending between the pico fuses. The housing is shaped to define a restricted contact area at the bottom that limits the chance of the contacts being placed accidentally at a location to cause damage to closely arranged adjacent pico fuses under test and thus obviates the problem of causing fuse short-out during measuring of the closely arranged fuses. When a pico fuse is open or shorted, this condition can be readily indicated upon testing by lighting a light emitting diode (LED) lamp built into the detector body. The LED can be activated by a test circuit that is coupled by a spring to the conductive lead and may be in the form of a typical oscillation circuit built into one of the probe arms and powered by a battery built into the other probe arm. The provision of the probe arms with adjustable spacing, the isolation of the test contacts on the ends of the arms, and the readily readable test results, makes it very convenient to easily, accurately, and safely test closely arranged pico fuses with the detector assembly in which these features are incorporated.

BRIEF DESCRIPTION OF THE DRAWINGS

The objects, features and advantages of the present invention will become apparent from the following detailed description and the appended drawings in which:

FIG. 1 illustrates a detector assembly incorporating the present invention;

FIG. 2 illustrates the structure of a probe element in accordance with the present invention that is disposed on the ends of the arms of the detector assembly of FIG. 1;

FIG. 3 is a schematic diagram of a circuit incorporated into the detector assembly to cooperate with the probe element of FIG. 2 for lighting an LED lamp in the assembly to indicate an open or shorted pico fuse under test.

DETAILED DESCRIPTION OF THE PREFERRED EMBODIMENT

A pico fuse detector assembly including a probe structure in accordance with the present invention is shown in FIG. 1. As seen in the Figure, the assembly has two probe arms, 10 and 11, each pivotably connected at one end to a detector body 12 with their free ends, 10a and 11a, adjustably dispaceable from each other by means, for example, of a caliper-type adjustable distance assembly or screw-operated adjustment component 14, extending between the arms to set the distance between them. The probe arms, 10 and 11, may be of plastic and tubular in shape with their free ends, 10a and 11a, respectively accomodating improved probe elements 16 thereon. As shown in FIG. 2, each probe element 16 is mounted to the free end of its arm and has a conductive lead 20, disposed inside an insulating sleeve or housing 22, connected at its lower end to a set of test contacts, 24a and 24b, extending through the bottom of the sleeve 22. The upper end of the conductive lead 20 is connected to a coil spring 18, which couples the lead to a test circuit. The insulating housing 22, of a non-conductive material such as plastic, may be generally cylindrical in shape and surrounds the conductive lead 20, e.g., of a suitable metal, and has an angled surface 22a on one side that results in and defines a decreased area opening at the bottom. The test contacts, 24a and 24b, may be dual-leaf in form for engaging the conductors 26 connected to either side of a pico fuse 28 being tested (FIG. 1). The restricting of the contact area with the angled isolating housing 22 facilitates the precise positioning of the contacts, 24a and 24b, on each probe, Probe 1 and Probe 2, and limits the chance of the contacts damaging two closely arranged adjacent pico fuses under test, thus obviating the problem of fuse short-out due to and during measuring of the closely disposed fuses. Also, the contacts 24a and 24b and lead 20 are axially movable by virtue of spring-mounting to the test circuit by spring 18.

To further simplify the testing process, when a pico fuse is open or shorted, this condition can be readily indicated by lighting an LED lamp 30 built into the detector body 12. The LED 30 may be activated by a test circuit, e.g., a typical oscillation circuit of the type shown in FIG. 3, that can be built into one of the probe arms (11) and powered by a battery V built into the other probe arm (10). As seen in FIG. 3, the LED 30 is connected on one side to the battery V and on the other to ground through resistor R3 and transistor Q3, so that the LED will light when transistor Q3 is conducting. The gate of transistor Q3 is connected to and controlled by the conduction of transistor Q4, the conduction of which, in turn, is controlled by conduction through the circuit leg containing resistor R2, field effect transistor (FET) E, resistor R1, and the test contacts of Probe 1. The FET E is controlled by coupling to the circuit leg including resistors RE and Re and capacitor CE. The respective test contacts on Probes 1 and 2, at the ends of the two arms 10 and 11, are respectively connected to the resistor R1 and to ground, and when testing a pico fuse respectively engage the conductors 26 connected to either side of a pico fuse 28 being tested (FIG. 1). This combination of circuit components operates to cause the LED 30 to flash when the Probes 1 and 2 are shorted through the pico fuse being tested, or to emit a steady light or go off when the link across the Probes is open due to an open fuse.

The provision of the probe arms with adjustable spacing, the protection of the test contacts on the ends of the arms, and the readily readable test results, makes it very convenient to easily, accurately, and safely test closely arranged pico fuses with the detector assembly in which these features are incorporated.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

What is claimed is:

1. A detector assembly for testing open or shorted pico fuses closely arranged adjacent to each other with conductors disposed between them, comprising:
   a detector body;
   a pair of probe arms, each having one end pivotally mounted on said detector body;
   means for pivotally adjusting the distance between the other ends of said probe arms;
   a test circuit disposed in said assembly;
   a pair of probe elements respectively disposed on the other ends of said probe arms, each probe element comprising:
      contact means for engaging one of said conductors on one side of a pico fuse to be tested;
      a conductive element coupled at one end to said contact means;
      means for spring-mounting the other end of said conductive element to said test circuit;
      housing means, attached at its upper end to the other end of its respective probe arm, for enclosing said conductive element and having a defined opening at its lower end for accomodating said contact means to facilitate the precise positioning of the contact means on said conductor.

2. A detector assembly as in claim 1 wherein said test circuit is disposed in one of said probe arms.

3. A detector assembly as in claim 2 further comprising a power supply for said test circuit disposed in the other of said probe arms.

4. A detector assembly as in claim 1 further comprising LED means, disposed in said detector body and activated by said test circuit, for indicating an open or shorted pico fuse under test.

5. A detector assembly as in claim 1 wherein said test circuit is an oscillation circuit.

6. A detector assembly as in claim 1 wherein said probe arms are tubular members.

7. A detector assembly as in claim 1 wherein said housing means comprises a generally cylindrical hollow member at its upper end and with an angled surface on one side that defines a decreased area opening at the bottom.

8. A detector assembly as in claim 1 wherein said means for pivotally adjusting the distance between the other ends of said probe arms comprises a screw-operated adjustment assembly.

9. A detector apparatus for use in testing fuses that are closely arranged adjacent to each other with conductors disposed between them, comprising:
   a test circuit;
   a body member;
   a pair of probe arms, each having one end pivotally mounted on said body member;
   an adjustment device arranged to pivotally adjust the distance between the other ends of said probe arms;
   a pair of probe elements respectively disposed on said other ends of said probe arms, each probe element comprising:
      a contact for engaging one of said conductors on one side of a fuse to be tested;
      a conductive element coupled at one end to said contact and having the other end spring-mounted to said test circuit; and
      a housing enclosing said conductive element and attached at one end to said other end of the respective probe arm on which the probe element is disposed and having a defined opening at the other end for accommodating said contact to facilitate the precise positioning of the contact on said one of said conductors.

10. A detector apparatus as in claim 9 wherein said test circuit is disposed in one of said probe arms.

11. A detector apparatus as in claim 10 further comprising a power supply for said test circuit disposed in the other of said probe arms.

12. A detector apparatus as in claim 9 further comprising an LED, disposed in said body member and activated by said test circuit, for indicating an open or shorted fuse under test.

13. A detector apparatus as in claim 9 wherein said test circuit is an oscillation circuit.

14. A detector apparatus as in claim 9 wherein said probe arms are tubular members.

15. A detector apparatus as in claim 9 wherein said housing comprises a generally cylindrical hollow member at said one end and with an angled surface on one side that defines a decreased area opening at the bottom.

16. A detector apparatus as in claim 9 wherein said adjustment device comprises a screw-operated adjustment assembly.

* * * * *